United States Patent [19]
Downing

[11] Patent Number: 5,956,172
[45] Date of Patent: *Sep. 21, 1999

[54] SYSTEM AND METHOD USING LAYERED STRUCTURE FOR THREE-DIMENSIONAL DISPLAY OF INFORMATION BASED ON TWO-PHOTON UPCONVERSION

[75] Inventor: Elizabeth Anne Downing, Palo Alto, Calif.

[73] Assignee: 3D Technology Laboratories, Inc., Mountain View, Calif.

[ * ] Notice: This patent is subject to a terminal disclaimer.

[21] Appl. No.: 08/963,233

[22] Filed: Nov. 3, 1997

Related U.S. Application Data

[63] Continuation of application No. 08/435,062, May 8, 1995, Pat. No. 5,684,621.

[51] Int. Cl.⁶ .......................................................... G02F 1/35
[52] U.S. Cl. ............................................ 359/326; 365/151
[58] Field of Search ................................... 359/326–332; 372/6, 39–42; 365/151; 501/40, 50, 64, 78, 101, 123, 126, 904–906

[56] References Cited

U.S. PATENT DOCUMENTS

| | | | |
|---|---|---|---|
| 3,829,838 | 8/1974 | Lewis et al. | 340/172.5 |
| 3,922,061 | 11/1975 | Glass et al. | 359/326 X |
| 4,471,470 | 9/1984 | Swainson et al. | 365/127 |
| 4,870,485 | 9/1989 | Downing et al. | 358/90 |
| 5,022,040 | 6/1991 | Pollack et al. | 372/41 X |
| 5,268,862 | 12/1993 | Rentzepis | 365/151 |
| 5,309,452 | 5/1994 | Ohishi et al. | 372/6 |
| 5,378,664 | 1/1995 | Becker et al. | 501/40 |
| 5,388,110 | 2/1995 | Snitzer | 372/6 |
| 5,472,759 | 12/1995 | Chen et al. | 428/65.1 |
| 5,684,621 | 11/1997 | Downing | 359/326 |

OTHER PUBLICATIONS

R. Zito, Jr., "Rate Analysis of Multiple–Step Excitation in Mercury Vapor", J. Appl. Phys. vol. 34, No. 5, May 1963, pp. 1535–1543.

J.D. Lewis et al., "A True Three–Dimensional Display,", IEEE Trans. Electron. Dev., vol. ED–18, No. 9, Sep. 1971, pp. 724–731.

A.C. Tropper et al., "Analysis of blue and red laser performance of the infrared–pumped praseodymium–doped fluoride fiber laser", J. Opt. Soc. Am. B/vol. 11, No. 5, May 1994, pp. 886–893.

J.K. Radhakrishnan et al., "Thermoluminescence and fluorescence emission of CsC1: Sm crystals", J. Lumin., vol. 63, 1995, pp. 137–142.

*Primary Examiner*—John D. Lee
*Attorney, Agent, or Firm*—Wilson Sonsini Goodrich & Rosati

[57] ABSTRACT

Three-dimensional objects are displayed in real time within a solid volume of optically transparent material by utilizing two infrared laser beams of different wavelengths to create visible light inside the display material via a two-photon upconversion process. Objects comprising points, lines, surfaces, and volumes are drawn by decomposing them into a set of small three-dimensional cells or "voxels" located at specific coordinates inside the display medium. Individual voxels are addressed and activated by intersecting the two invisible infrared laser beams at the appropriate coordinate locations. The display material is tailored to provide efficient upconversion in the region of intersection, with minimal visible light generated outside this region by either one of the infrared beams alone. Typical media are rare-earth-doped glasses or crystals having low phonon energies. The general methods for selecting and producing the display material, along with a plurality of system configurations for addressing the display, are disclosed.

59 Claims, 15 Drawing Sheets

SYSTEM AND METHOD USING LAYERED STRUCTURE FOR THREE-DIMENSIONAL DISPLAY OF INFORMATION BASED ON TWO-PHOTON UPCONVERSION

This application is a continuation of application Ser. No. 08/435,062, filed May 8, 1995 now U.S. Pat. No. 5,684,621.

BACKGROUND OF THE INVENTION

The present invention relates generally to three-dimensional display of information in an optically transparent solid medium that is doped with at least one active ion or molecule to provide conversion of infrared radiation to visible light by means of a two-photon upconversion process. The invention also relates to the use of laser diodes, laser diode arrays, and tunable solid-state lasers as sources of the infrared pumping radiation.

Two-photon absorption is a well known process in which two distinct photons of the same or different energies are absorbed by an ion or molecule, causing excitation from the ground state to a higher energy state to be achieved. The excitation pathway can involve either a real or virtual intermediate energy state, with the former case also referred to as resonant two-step absorption. In either case, the ion or molecule remains in the upper excited state for a short time, commonly known as the excited state lifetime, after which it relaxes back to the ground state, giving up the excess energy in the form of phonons (referred to as nonradiative relaxation) or photons (referred to as radiative relaxation, leading to upconversion fluorescence or possibly stimulated emission). When considering fluorescence, an important figure of merit is the quantum efficiency, defined to be the visible fluorescence intensity divided by the total input pumping intensity.

For display applications based on two-photon induced fluorescence, radiative relaxation must dominate over non-radiative relaxation in order to obtain a sufficient quantum efficiency, and moreover, the two infrared photons must derive from separate sources with distinctly different wavelengths so that visible fluorescence occurs only in those regions of the host material where the beams from the separate sources overlap. In this way a true three-dimensional image or sequence of images can be drawn in the material by rapidly scanning or otherwise manipulating the pump beams, which are invisible to the eye, so as to activate the appropriate voxels comprising the images. To ensure that visible fluorescence is generated only in the region of pump beam overlap, single-frequency upconversion arising from two-photon absorption of the individual infrared beams must be minimized; otherwise, visible "streaking" of the pump beams will be apparent.

Earlier efforts to develop volumetric 3-D displays based on two-photon induced fluorescence were hindered by the lack of transparent host materials exhibiting high quantum efficiencies, and by the lack of convenient laser pump sources at the excitation wavelengths of the active ions. In 1963, R. Zito proposed a display in mercury vapor that required pump sources at 250 nm and 400 nm (Appl. Phys., Vol 34, 1963, pg 1535), but this approach was limited in a number of important ways including the need for intense lasers in the ultraviolet and blue regions of the spectrum as well as the problems associated with containing a large volume of toxic mercury. For these and other reasons, the Zito display was not pursued beyond the point of conceptualization.

An upconversion display using infrared excitation sources in Er-doped $CaF_2$, described by J. D. Lewis et al. in a 1971 publication (IEEE Trans. Electron Dev., Vol ED-18, 1971, pp 724–732) and in U.S. Pat. No. 3,829,838 entitled "Computer-Controlled Three-Dimensional Pattern Generator," suffers from low quantum efficiency and weak fluorescence inherent to the use of $CaF_2$ as a host material. The poor performance of this host is related to its high phonon energy which promotes radiationless relaxation via phonon production. In addition, the use of $Er^{3+}$ as the active ion is now known to be a poor choice for upconversion display because it possesses a preponderance of closely spaced spin-allowed transitions, making single-frequency upconversion, and its concomitant streaking effect, a significant problem. More specifically, when each of the individual infrared pumping wavelengths cited in their patent (namely 1.53, 1.14, 0.84 and 0.79 $\mu$m) is focused separately into $Er^{3+}:CaF_2$, green light is readily generated along most of the beam path. The problem of addressing the issue of single-frequency upconversion and its deleterious effect on the performance of the display is strikingly absent from the prior art. Lastly, trivalent erbium has a multitude of closely spaced energy levels located above those from which visible light is emitted. These higher levels offer pathways for depletion of the desired levels through additional excited-state absorption, thereby effectively reducing the quantum efficiency.

Recent research into heavy-metal fluoride glasses has yielded many new rare-earth-doped glasses that are also well suited for use in two-photon 3-D display applications. This materials research has been motivated largely by the need for efficient fiber amplifiers (M. A. Newhouse et al., IEEE Phot. Tech. Lett., Vol. 6, 1994, p. 189) and for fiber lasers (A. C. Tropper et al., J. Opt. Soc. Am. B, Vol. 11, 1994, p. 886) in the telecommunication industry, and by the need for short wavelength lasers for high-density optical data storage (W. J. Kozlovsky et al., Proc. Soc. Instr. Eng., Vol. 1663, 1992, p. 410). The development of volumetric 3-D display as disclosed in this invention is further facilitated by the commercial availability of high-power infrared laser diodes, laser diode arrays, and tunable solid-state infrared lasers.

There exists a multitude of applications for a solid-state 3-D display system that does not require special viewing devices (e.g., glasses, headgear) and offers viewing access from a wide range of positions with minimal restrictions. For example, air traffic control and other radar-based technologies could effectively utilize such a system to display three-dimensional scenes in real time. Another major application area includes medical imaging, in which highly developed three-dimensional data acquisition systems based on ultra-sound, magnetic resonant imaging, and cat-scans are currently being used. Engineering work stations and computational finite element analysis packages would also benefit since data that has three spatial dimensions often has temporal variations in other parameters like pressure, temperature, stress, velocity, etc., which can be displayed by means of dynamic 3-D color images. Entertainment in the form of video games and 3-D movies is yet another area of significant opportunity for this technology.

SUMMARY OF THE INVENTION

It is the primary object of the present invention to provide a method and system for three-dimensional display of information based on two-photon upconversion which are not subject to the shortcomings of the prior art as discussed above in the Background of the Invention.

The method for achieving this objective and other objectives consists of using two-photon upconversion of near-infrared radiation to produce visible light at selective locations, known as voxels, inside a transparent solid-state medium that is doped with an active ion or molecule. The near-infrared radiation takes the form of two intersecting laser beams or multiple pairs of intersecting beams. A voxel, which is a small three-dimensional display cell, is formed at each intersection region and has a spatial extent determined by the size of the two focused infrared pump beams in their region of overlap. Typically a voxel has a linear dimension, measured along any side, in the range from 50 $\mu$m to 1 mm.

The two beams comprising each intersecting pair of pump beams have separate wavelengths that are tuned to provide for two-photon absorption by the active ion or molecule that is embedded in the host material. The two-photon absorption results in visible fluorescence at a voxel location. Once activated, a voxel acts as a point source of visible fluorescent light and can, in principle, be viewed from any direction, although system constraints may restrict to some extent the available viewing range. A three-dimensional image is formed by activating the appropriate set of voxels comprising the image, analogous to the way in which a two-dimensional image is displayed on a cathode ray tube by activating a collection of phosphorescent pixels.

A voxel will emit light for the entire time that both pump beams are present in its location. After the pump lasers have been turned off or have moved to another voxel location, the previously activated voxel will continue to emit light for a period equal to the lifetime of the excited state of the active ion or molecule. This characteristic energy decay time allows many thousands of voxels to be turned on by only a few pairs of pump lasers which are rapidly scanned throughout the display. In this way, multiple voxels are turned during a single frame time segment to form a three-dimensional image inside the display volume. The object or scene being displayed can be transformed in time (i.e., translated, rotated, scaled, skewed, etc.) or otherwise altered to depict motion.

The present invention discloses three general energy level configurations for optimal two-photon upconversion with minimal single-frequency upconversion. One configuration corresponds to single-species doping while the other two correspond to dual-species doping. In the single-species case, efficient upconversion is obtained, in part, by having a long-lived intermediate state that is strongly coupled to the upper pump-excited state. Additionally, phonon-mediated transitions from the upper pump-excited state to nearby levels provides for efficient multi-wavelength visible fluorescence. In the two cases of dual-species doping, energy transfer from one type of dopant to a second type is used to reach the uppermost energy levels of the second dopant (which provides the fluorescence). The energy transfer process, occurring in the form of discrete packets, can connect real excited states of the two dopants, or alternatively, it can proceed in a photon-assisted fashion if the fluorescent dopant does not possess a real intermediate excited state.

To obtain sufficient upconversion efficiency, the active ion or molecule is doped into a host material that is characterized by wide transparency, from the visible through the far infrared, and by low phonon energies, less than 500 $cm^{-1}$. Low phonon energies are needed to minimize nonradiative relaxation which competes with the desired fluorescence. Low-phonon energy materials typically have extended transparency into the far infrared because absorption of far-infrared radiation arises from the conversion of the radiation energy into phonons.

The present invention identifies three classes of low-phonon host materials that are suitable for upconversion display. These include (1) the heavy metal halide glasses based on zirconium, hafnium, indium, zinc, and other heavy metals, (2) chalcogenide materials, in particular those based on sulfides of the 3rd and 4th group elements of the periodic table, and (3) low-phonon alkali-metal halide crystals such as NaCl, KCl, KBr, CsBr, and CsI.

A number of different prototype material systems (i.e., host plus dopant, or doped material or material system) have been studied and the preliminary results are disclosed. These include Pr-doped, Tm-doped, and Pr/Yb-codoped heavy metal halide glasses. Pumping is carried out with compact laser diodes, and three-dimensional figures are drawn in the bulk. Multiple color fluorescent emission is observed and quantitatively measured.

Several schemes for producing and controlling individual colors are described. These include: (1) wavelength multiplexing in which the wavelength of one or both of the pump beams is tuned to select a specific color, (2) pulse-length multiplexing in which the pump beams are pulsed in time and individual colors are addressed by selecting the appropriate pulse length durations, (3) layered monolithic structures comprising a fundamental set of thin layers corresponding to primary colors (e.g., Red, Green, and Blue), each layer containing a unique dopant or combination of dopants tailored to fluorescence one of the primary colors; replication of the fundamental set of layers is used to produce a bulk display volume, and (4) the use of an active external color filter that transmits specific wavelengths from a set of multiple fluorescent wavelengths that are produced by the upconversion process.

The present invention further provides a plurality of systems for addressing the upconversion display. These include scanning multiple laser beams pairs in parallel (by using, for example, linear diode laser arrays) as well as scanning a sheet of laser radiation in combination with one or more individual laser beams. Recently developed diode lasers and diode-pumped solid-state lasers can also be used in combination with conventional deflective scanning technologies (such as mechanically or galvanometrically driven mirrors, or acousto-optical deflectors) to rapidly direct the pump radiation around inside the display medium to draw 3-D images. In addition, an array of micro-mechanical mirrors may be used for high-speed deflection of several sets of pump beams in parallel. Yet another approach involves the use of two-dimensional arrays of independently addressable laser diodes that are focused (either statically or dynamically using, for example, micro-lens arrays), thereby turning on a large number of pixels simultaneously without the need for beam deflection.

Other features and advantages of the present invention will become apparent from the following detailed description, taken in conjunction with the accompanying drawings, which illustrate, by way of example, the principles of the invention.

DETAILED DESCRIPTION OF THE PREFERRED EMBODIMENTS

A. Two-photon Upconversion for 3-D Information Display

For the display to operate effectively, two fundamental conditions of the material system must, at a minimum, be satisfied. First, the active ion or molecule must be capable of undergoing the two-photon upconversion process by absorbing two different wavelengths of infrared radiation to produce visible fluorescent light. Secondly, the active ion or molecule must be doped in a transparent host material, generally one that allows the upconversion process to occur with a useful fluorescence quantum efficiency.

Two-photon upconversion occurs when the active ion or molecule first undergoes an excitation from the ground state to an intermediate excited state (either real or virtual) through absorption of an infrared photon having wavelength $\lambda_{12}$. An additional excitation from the intermediate state into a second, higher energy level then occurs upon absorption of a second infrared photon having a different wavelength $\lambda_{23}$. Radiative relaxation from the second excited state (or from a nearby level that readily couples to the second excited state) to the ground state (or a level in the vicinity of the ground state) produces the desired visible fluorescence. In this manner, two infrared photons are absorbed, and one visible photon is created for each excitation-emission process. The time sequence of events is such that the second photon at wavelength $\lambda_{23}$ can either be absorbed simultaneously with or subsequent to the absorption of the first photon at wavelength $\lambda_{12}$.

Figure 1:
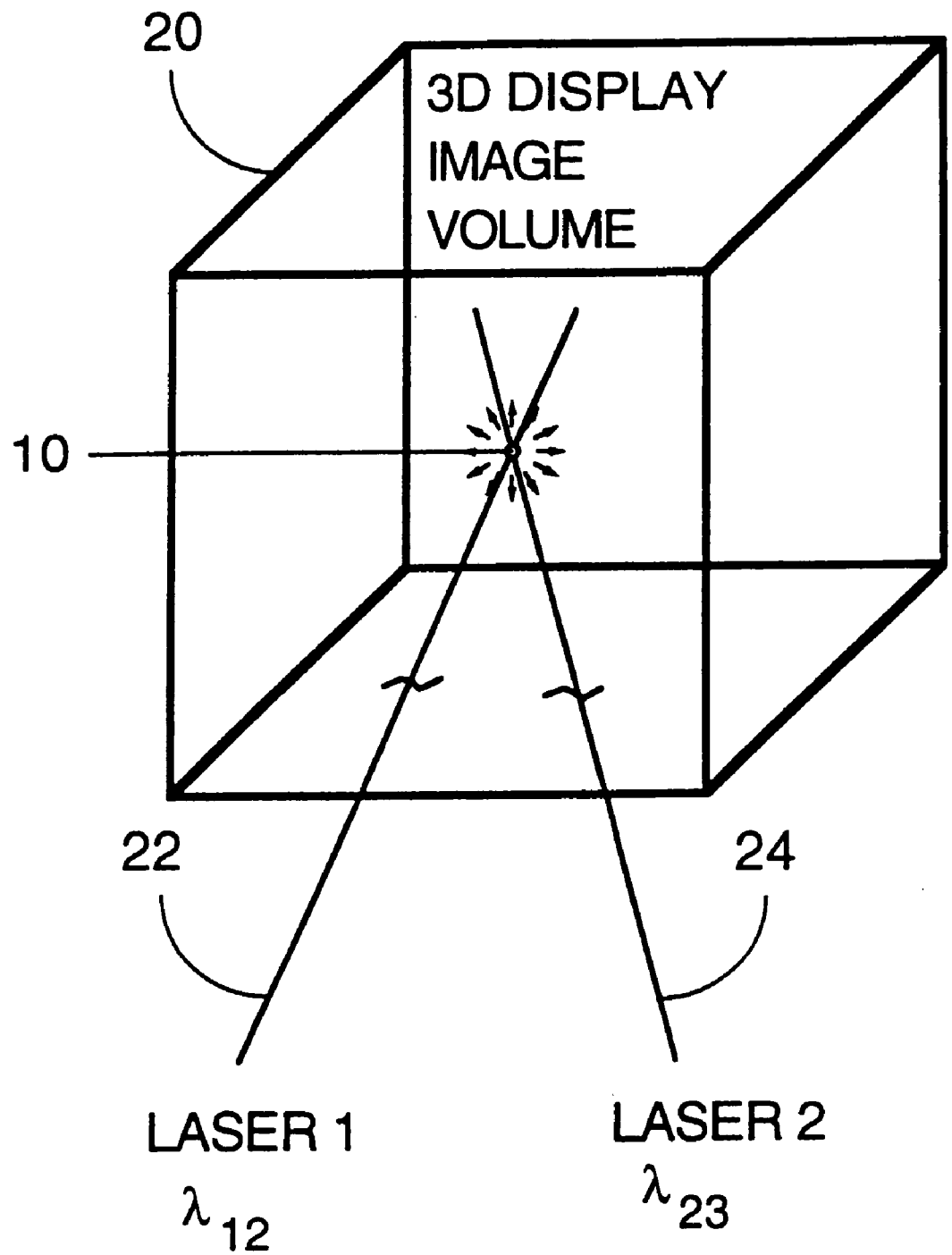
FIG. 1 depicts a fluorescent voxel inside a transparent display medium.

Under continuous excitation, an individual ion or molecule can produce anywhere from a few hundred to several million visible photons per second, depending on the excitation intensity, the lifetime of the energy levels involved, and the degree to which radiationless relaxation occurs. Referring to FIG. 1, a small three-dimensional fluorescent cell 10, or so-called "voxel," is formed when two infrared beams 22 and 24 having wavelengths $\lambda_{12}$ and $\lambda_{23}$ intersect in the host material 20. The fluorescence from voxel 10 arises from the collective behavior of those ions or molecules contained in the region of intersection and, as discussed in more detail below, may be comprised of more than one wavelength, thereby allowing for multi-color display.

In addition to discrete two-wavelength absorption, the excited state lifetimes of the ion must be sufficiently short (strong coupling between excited and ground states), to allow entire image refresh rates at 20–30 Hz to avoid the perception of "flicker" by the viewer. This condition will allow dynamic images to be drawn without the blurring associated with long-lived persistent fluorescence. Longer excited state lifetimes can still be employed for static image display applications.

B. Single-Species Upconversion

Figure 2:
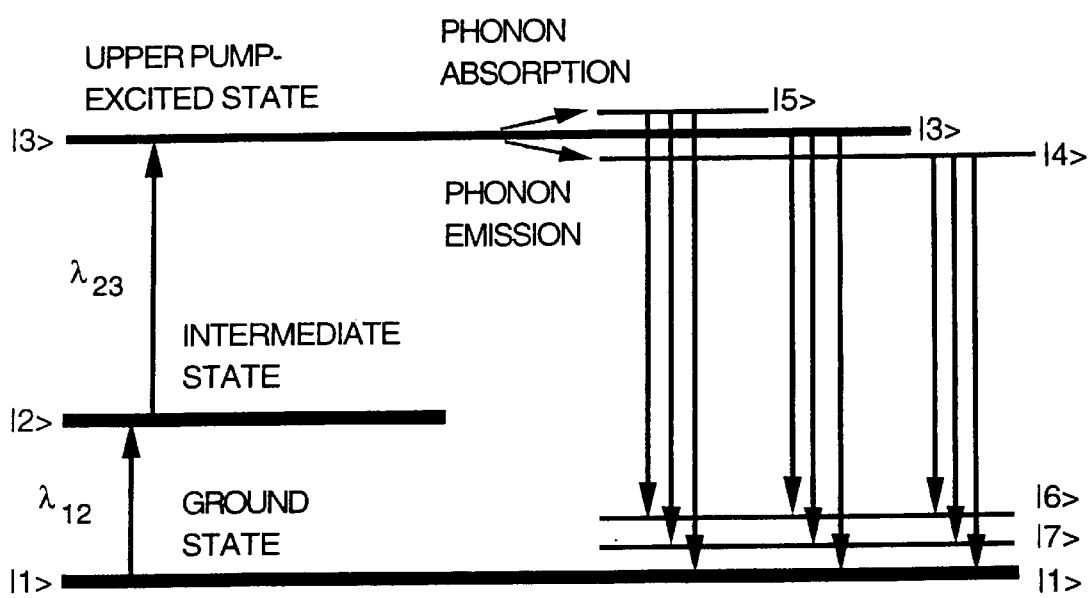
FIG. 2 is a general energy level diagram for a single dopant that is suitable for two-photon upconversion.

One aspect of the present invention involves the identification of an energy level configuration, as shown in FIG. 2, that is applicable to a host material doped with a single species of active ion or molecule. This configuration for two-photon upconversion provides: (1) a means for excitation from a ground state into an upper pump-excited state, via an intermediate state, by absorption of two photons, (2) a multiplicity of states in the vicinity of the upper pump-excited state, to which phonon-mediated transitions can occur, (3) a multiplicity of states in the vicinity of the ground state, (4) strong radiative coupling from the uppermost excited states to the lower lying levels, producing multi-wavelength fluorescence with high quantum efficiency, and (5) minimization of single-frequency upconversion. Therefore, this invention, in part, serves to point out new and important characteristics of the active ion or molecule that are not addressed in the prior art, and are required to construct a viable 3-D display based on two-photon upconversion.

The discussion here will be restricted to atoms and ions, as this will serve to illustrate the fundamental concepts, although it will be appreciated by those skilled in the art that a similar description can also-be developed for molecules. Bearing this in mind, the energy levels in FIG. 2 are identified by quantum states denoted $|1>, |2>, |3>, \ldots |7>$, a notation which is shorthand for the more rigorous representation of the quantum state by four independent quantum numbers S, L, J, M (see, for example, L. I. Schiff, *Quantum Mechanics*, Third Edition, McGraw-Hill, 1968, p. 435). These quantum numbers correspond, respectively, to the spin, the orbital angular momentum, the total angular momentum, and the component of J along a specified axis (typically taken to be the z axis). In order to observe quantization effects related to M, there must be some way of defining the z axis in space, such as by the application of an external magnetic field. Since no external magnetic field is used in the present invention, each energy level is completely characterized by the three quantum numbers S, L, and J such that $|1>=|S_1,L_1,J_1>, |2>=|S_2,L_2,J_2>, \ldots |7>=|S_7,L_7,J_7>$.

Transitions between the various levels are governed by selection rules and transition probabilities. For electric dipole transitions, which comprise the most common type of transitions involving electromagnetic radiation, the well-known selection rules require that $\Delta S=0$, $\Delta L=0$, $+1$ or $-1$, and $\Delta J=0$, $+1$, or $-1$ (P. H. Heckman and E. Trabert,

*Introduction to the Spectroscopy of Atoms,* North-Holland, 1989, pg 55). These selection rules apply strictly to free atoms and ions. When the atoms and ions are incorporated into a solid host, their quantum states are perturbed by the surrounding environment in such a way that many of the so-called "forbidden" electric dipole transitions (i.e., those transitions that do not satisfy the selection rules) actually become readily observable. In fact, it is noteworthy that such transitions are typically associated with the creation of excited states having characteristically long lifetimes, a particularly useful feature when applied to the intermediate state in a two-step upconversion process. A long-lived intermediate state is advantageous because the rate at which transitions occur from this state to the second, higher-energy excited state is linearly proportional to the intermediate state lifetime. Hence, longer intermediate state lifetimes generally lead to greater population of the uppermost excited states with a corresponding increase in the visible fluorescence intensity.

Early work on the use of two-photon upconversion for 3-D display appears to have centered only on the use of allowed electric dipole transitions, with spin-forbidden transitions being avoided. For example, Er-doped crystals of $CaF_2$ were investigated because the majority of the energy levels below 22,000 $cm^{-1}$ are quartets (i.e, they all have $m=2S+1=4$, implying $S=3/2$), meaning that transitions between these levels are spin-allowed. However, as previously noted in the Background of the Invention, Erbium is a poor candidate ion owing to its propensity for single-frequency upconversion and the associated "streaking" problem.

Referring again to FIG. 2, of particular interest in the present invention is the situation in which all of the photon-related transitions abide by the $\Delta\Lambda$ and $\Delta\theta$ selection rules, but not the $\Delta S$ selection rule for spin. More specifically, if the $\lambda_{12}$ transition does not satisfy $\Delta S_{12}=S_1-S_2=0$, then ground state $|1>$ is weakly coupled to intermediate state $|2>$. Therefore, resonant pumping of an ion into state $|2>$ by $\lambda_{12}$ produces a long-lived intermediate state which, as described above, can then be used to efficiently populate the upper pumped-excited state $|3>$ by $\lambda_{23}$ if this second step is spin-allowed such that $\Delta S_{23}=0$. At this point, it is advantageous to have phonon-mediated transitions, which are not subject to the $\Delta S=0$ selection rule, occurring from state $|3>$ to other nearby energy levels, denoted $|4>$ and $|5>$, that have the same value of S as ground state $|1>$ and other levels, $|6>$ and $|7>$, that are located somewhat above the ground state. In mathematical terms this criterion means $S_4=S_5=S_1=S_6=S_7$ (not equal to) $\_S_2=S_3$. Because the spin selection rule is satisfied for downward transitions from states $|4>$ and $|5>$ to states $|6>$, $|7>$, and $|1>$, these transitions, which produce the desired visible fluorescence, are favored over radiative relaxation via the intermediate state $|2>$ (which would generate infrared fluorescence and only degrade the performance of the display). This energy level scheme closely matches that of trivalent praseodymium as discussed more thoroughly in the section below entitled Prototype Material Systems.

C. Two-Species Upconversion via Energy Transfer

In addition to doping with one type of ion or molecule, mixtures of dopants (i.e., codoping) can be used effectively to generate upconversion fluorescence by utilizing energy transfer processes. In this case the energy contained in the excited state of one type of ion or molecule is transferred to a second type of ion or molecule in order to facilitate upconversion. The interionic or intermolecular energy transfer constitutes one step in the two-step upconversion process. Therefore, with proper codoping, discrete two-photon upconversion can be obtained even though the requisite energy level structure does not exist for either ion or molecule individually (or if it does exist, is simply too inefficient). It is important to note that careful selection of the dopant concentrations is needed for the energy transfer processes to work efficiently. In practice, the optimum concentrations can be determined by a systematic experimental study of the material system under investigation by one of ordinary skill in the art, using the teachings of the present invention as disclosed herein.

A variety of different energy transfer processes have been established (S. Hufner, *Optical Spectra of Transparent Rare Earth Compounds,* Academic Press, 1978, ch. 5). Only two of these processes are discussed here within the context of upconversion for 3-D display, it being understood that other energy transfer mechanisms may be used in similar ways to achieve the same general results.

Figure 3:
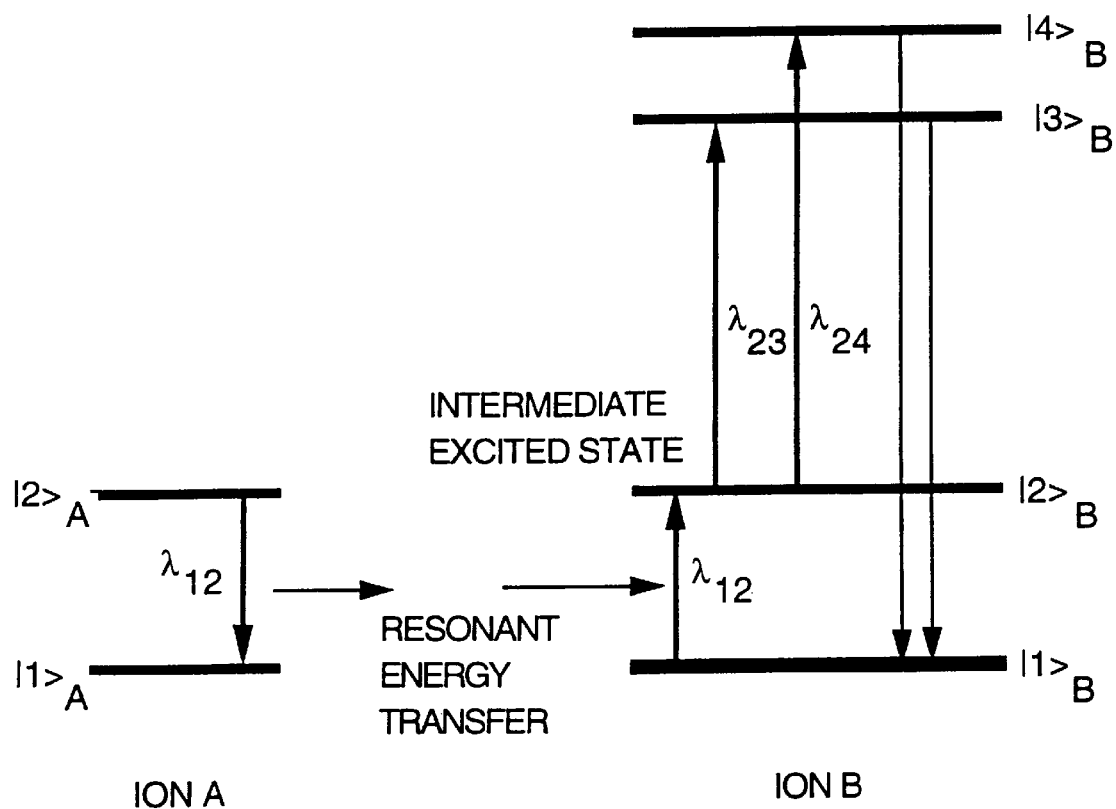
FIG. 3 depicts resonant energy transfer between two ions with the subsequent generation of upconversion fluorescence.

In the first case, as illustrated in FIG. 3, energy is transferred from the excited state of ion A to produce a real intermediate excited state of ion B. If the two transitions $|2>_A\rightarrow|1>_A$ and $|1>_B\rightarrow|2>_B$ have the same energy (as is the case in FIG. 3), then the interaction is considered resonant; otherwise, the energy differential may be compensated for by the absorption or emission of a low-energy phonon (i.e., the process is phonon-assisted). When phonon absorption is required, the temperature of the host material must be sufficient to provide the necessary reservoir of phonons throughout the material; typically, though, room temperature is sufficient (only at very low temperatures does this process become nonoperative). In contrast, phonon-assisted energy transfer that involves the emission or creation of a low-energy phonon is not subject to the same temperature constraint. Once ion B reaches the intermediate state $|2>_B$, it can be promoted to the second excited state $|3>_B$ through direct photon absorption. For example, the $^2F_{5/2}$ excited state in $Yb^{3+}$ can transfer energy to the $^1G_4$ level of $Pr^{3+}$, thereby populating this intermediate level and allowing for further excitation into the $^3P$ levels of $Pr^{3+}$. This technique is most useful if the intermediate excited state of ion B is more efficiently populated by energy transfer than by direct absorption of a photon.

Figure 4:
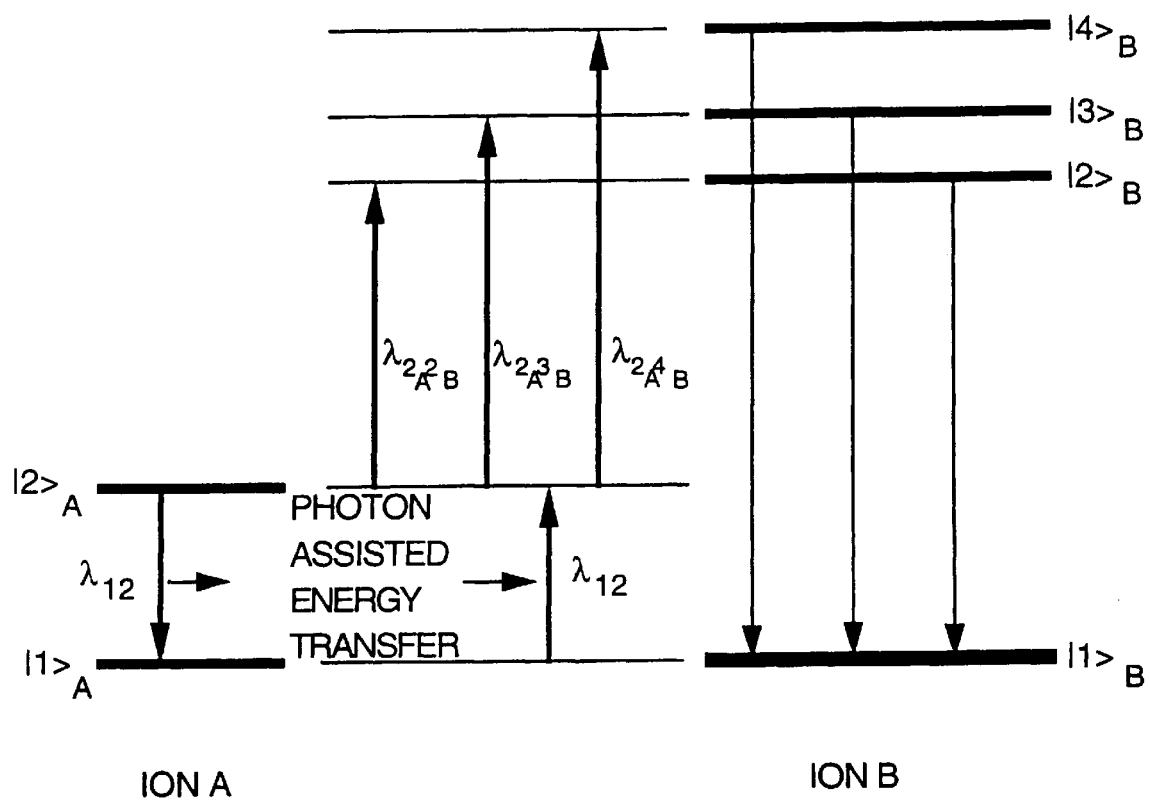
FIG. 4 depicts nonresonant, photon-assisted energy transfer between two ions, and subsequent upconversion fluorescence.
Figure 5:
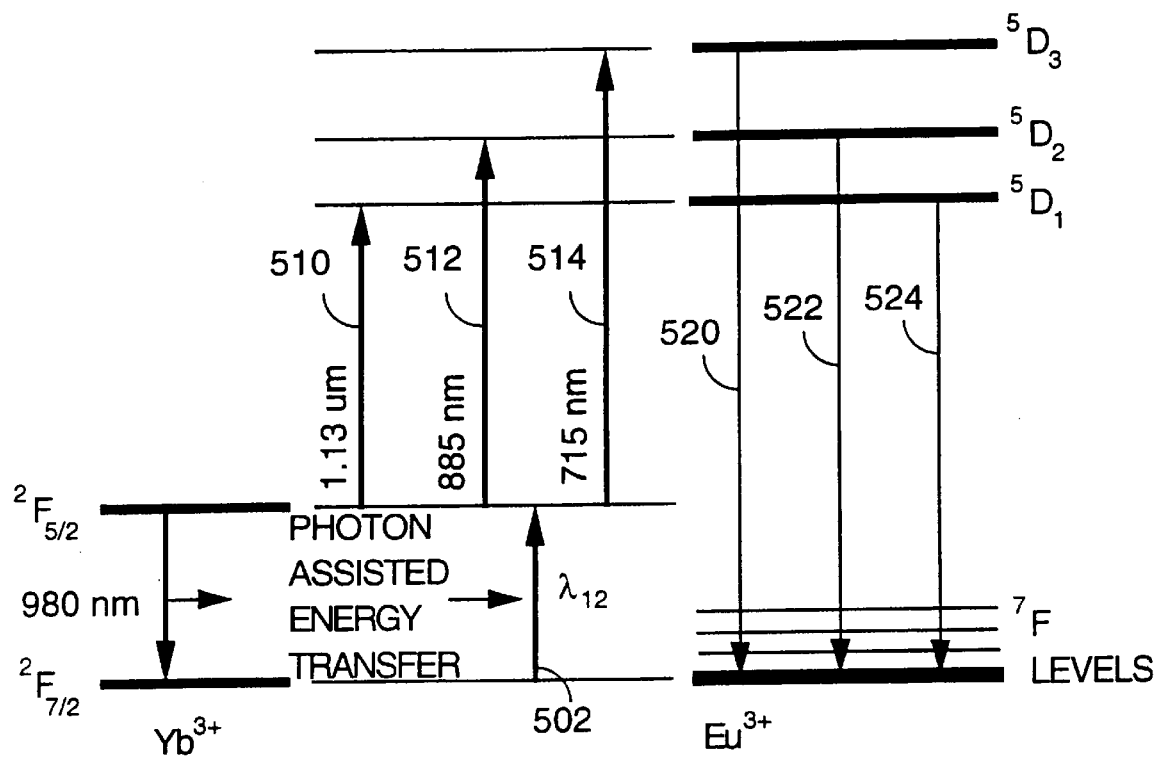
FIG. 5 illustrates a particular example of FIG. 4 in which photon-assisted energy transfer occurs between $Yb^{3+}$ and $Eu^{3+}$.

A second way in which energy transfer can be utilized is shown in FIG. 4. In this instance, the excited state of ion A does not transfer its energy to a real intermediate state of ion B. Instead, ion A gives up its energy in such a way that when combined with the simultaneous absorption of a photon having the proper energy, the net energy is sufficient to excite ion B directly into an upper state. This cooperative phenomenon, referred to as photon-assisted energy transfer, is utilized when an ion with the desired fluorescence properties is identified, but no suitable intermediate excited state exists in this ion to provide for direct two-photon absorption. For example, using standard spectroscopic notation, the $^2F_{5/2}$ excited state in $Yb^{3+}$ can be used in combination with radiation of various wavelengths in the 700–1130 nm range to directly excite $Eu^{3+}$ and $Tb^{3+}$ from their ground states into various $^5D$ levels from which visible fluorescence is then obtained. The $Yb^{3+}/Eu^{3+}$ case is shown in FIG. 5. Other rare earth ions that can participate in energy transfer with Yb include Tb, Nd, Tm, and Ho.

As noted from an inspection of FIGS. 3, 4 and 5, visible fluorescence from a plurality of upper states produces a plurality of different wavelengths (such as radiation from upper states $|4>_B$, $|3>_B$ and $|2>_B$), which in turn leads to a plurality of different colors, a feature that can be exploited for producing multicolor displays of visible fluorescence.

D. Solid-State Host Materials
1. General Properties of the Host

An efficient host material for the present invention should have a very large transparency range, beginning in the ultraviolet and extending into the far infrared (>8 μm). Doping the host produces specific absorption lines, but these lines should lie predominantly in the near infrared as required for absorption of the pump wavelengths. One of the primary factors governing the efficiency of the upconversion process is the range of phonon energies characteristic of the host material. Nonradiative relaxation, which occurs through the formation of phonons, or lattice vibrations, can rapidly deplete the excited-state energy levels. If sufficient energy is lost nonradiatively, even strong ground-state and excited-state absorption, combined with intense pumping, will not result in very much, if any, visible fluorescence.

The higher the available phonon energy, the more efficient nonradiative relaxation becomes since fewer phonons participate in the process. Because far-infrared absorption arises as a result of multi-phonon excitation, one way to identify appropriate low-phonon energy materials is in terms of extended far-infrared transparency. Generally, optical materials having phonon energies less than 500 cm$^{-1}$ are necessary but not always sufficient. Many materials are transparent in both the visible and near infrared regions of the spectrum but are not effective hosts for upconversion because their phonon energies are too high. Silicate glasses, which are highly transparent in the visible and comprise the most common form of glass, are examples of materials in which upconversion fluorescence is almost entirely quenched by nonradiative relaxation. Previous attempts to demonstrate upconversion 3-D display failed in part because the upconversion efficiencies in the available host materials, such as $CaF_2$, were extremely low.

Figure 6:
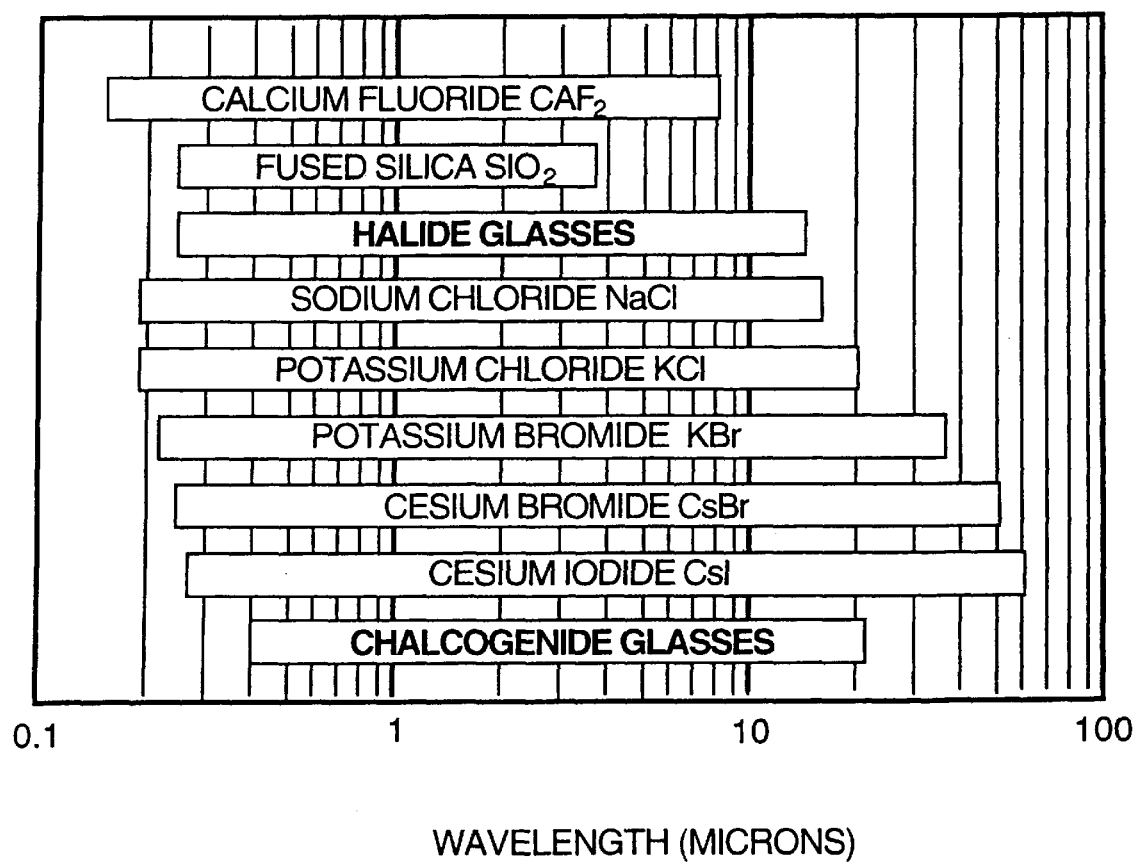
FIG. 6 shows the visible, near-infrared, and far-infrared transparency of several candidate host materials.

FIG. 6 shows the transparency range of several potential host materials for the present invention along with two, $CaF_2$ and $SiO_2$, that are not suitable. The shortcoming of both $CaF_2$ and $SiO_2$ is a direct result of their limited far infrared transparency, with IR cutoff edges falling below 8 μm. The two shaded candidates in FIG. 6, the halide and chalcogenide glasses, represent host materials that have been actually reduced to practice.

2. Low-Phonon Glasses

Heavy-metal halide glasses, which are based on the elements zirconium, barium, hafnium, indium, zinc, cadmium, and others, were identified in the mid 1970's as promising class of optical materials since they can be readily manufactured and possess phonon energies below those which are characteristic of other optical materials such as alkaline-earth fluoride crystals. One such glass, ZBLAN, with a composition of 53% ZrF4, 20% BaF2, 4% LaF3, 3% AlF3, and 20% NaF has phonon energies less than 500 cm$^{-1}$ and a transparency out to 8 μm. Variations on this composition (which include anions of Cl, Br, I, and cations of other heavy metals) form glasses with yet lower phonon energies and transparencies out to 13 μm. The variation in local environment surrounding the active dopant ion or molecule caused by the many glass forming constituents acts to perturb the site symmetry of the dopant, thereby increasing radiative transition probabilities between otherwise spin-forbidden transitions. Additionally, heavy-metal halide glasses have high damage thresholds enabling the laser beams to be focused to small spot sizes. This greatly increases the brightness of 3-D pixels and intrinsically reduces unwanted ghost pixels that would invariably result if collimated beams were used.

The chalcogenides constitute another class of glasses with far-infrared transparency beyond 20 μm. In particular, the sulfides of the third and fourth group elements on the periodic table have high transparency not only in the far infrared, but also throughout the visible region of the spectrum as well. They are also lower in density, thereby providing a lighter weight solution for large volume displays.

3. Low-Phonon Alkali-Metal Halide Crystals

Alkali-metal halide crystals, such as NaCl, KCl, KBr, CsBr, CsI, are also very promising host materials for efficient upconversion. As shown in FIG. 6, these crystals generally exhibit excellent transparency from below 300 nm out to 20–50 μm. They can be doped with rare earth and transition metal ions (see, for example, J. K. Radhakrishnan et al., J. Lumin, Vol 63, 1995, pp 137–142). Many of them can be grown in very large bulk volumes with high optical quality, as needed for a large display.

E. Methods for Producing Color
1. Wavelength Multiplexing

As the energy level diagram of $Eu^{3+}$ (FIG. 5) shows, the emission from the various excited $^5D$ levels back down to the ground state is comprised of several different wavelengths. By utilizing this feature, a solid-state 3D display with addressable RGB color can be envisioned in which the second pump wavelength is tuned to excite a specific upper state corresponding to a distinct fluorescence color. FIG. 5 shows the $Yb^{3+}/Eu^{3+}$ codoped system whereby a first wavelength ($\lambda_{12}$) is used to excite $Yb^{3+}$ ions, and a second ($\lambda_{23}$), third ($\lambda_{24}$), and fourth ($\lambda_{25}$) wavelengths (represented by ref. nos. 510, 512 and 514) are used to excite higher levels in $Eu^{3+}$. As before, the radiative relaxation from the higher levels to lower levels produces visible fluorescence, each transition corresponding to a specific fluorescence wavelength and thus a specific color (represented by wavelengths 520, 522, and 524 in FIG. 5). Generally, wavelength multiplexing can be used to provide multiple colors in a single display volume which has been suitably doped to provide a plurality of individually addressable upper excited states. Thus each of these individually addressable upper excited states are defined at least by a unique pair of wavelengths.

2. Pulse Length Multiplexing

Yet another concept for obtaining color is by the use of pulse length multiplexing in which both pump lasers, or at least the second level pump laser, is pulsed in time to preferentially populate specific upper excited states based on relative differences in the transition probabilities between the states. Excited states having highly allowed transitions can be populated with very short pulses, while less favored transitions require longer pulse lengths to acquire appreciable population. The pulse length durations used depend on the lifetimes of the states involved, with time scales typically ranging anywhere from $10^{-10}$ to $10^{-3}$ seconds. This has been demonstrated in holmium ions in which multiple excited levels are closely spaced.

Figure 7:
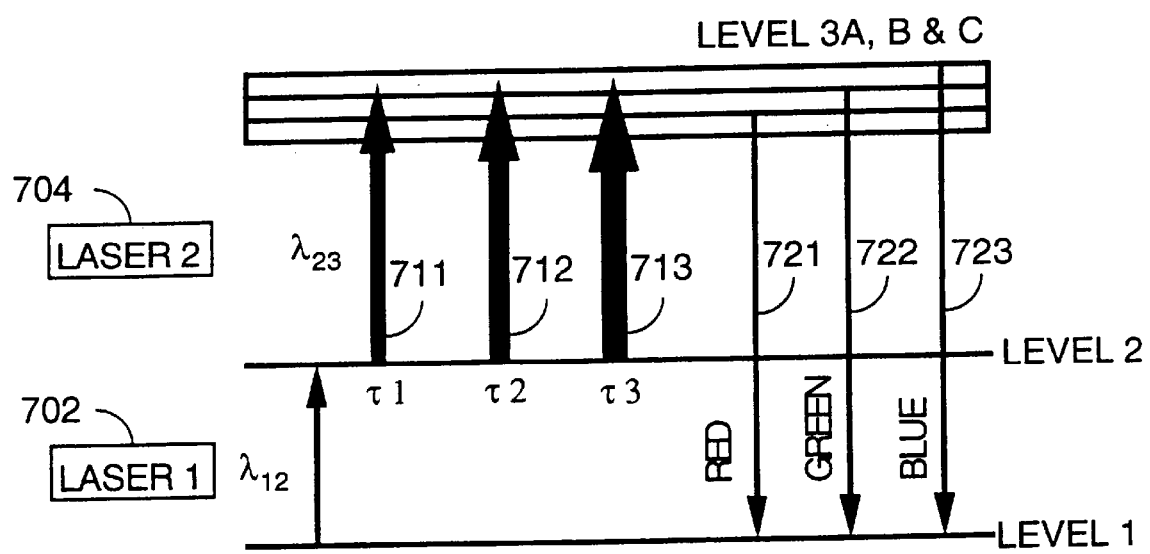
FIG. 7 is a general energy level diagram of an ion in which pulse length encoding of the pump laser pulse is employed to obtain addressable color.

FIG. 7 illustrates the general approach to temporal multiplexing as used to obtain addressable color. A first laser 702 having a laser wavelength $\lambda_{12}$ pumps a suitable material as disclosed by the present invention from a ground state (level 1) to an intermediate state (level 2), and a second laser 704 having a plurality of different pulse lengths (also known as pulse widths) stimulates the material from the second level 2 to one of several higher levels, each emitting a specific color upon radiative relaxation. Thus a pulse length 711 would stimulate the emission of a wavelength, say red, as designated by ref. no. 721, another different pulse length 712 would stimulate the emission of another wavelength, say green, as designated by ref. no. 722, and a third pulse length would stimulate the emission of a third color, say blue, as designated by ref. no. 723. Preferably with three primary colors, such as red, green and blue, one can combine such colors to produce other colors.

3. Layered Structures

Figure 8:
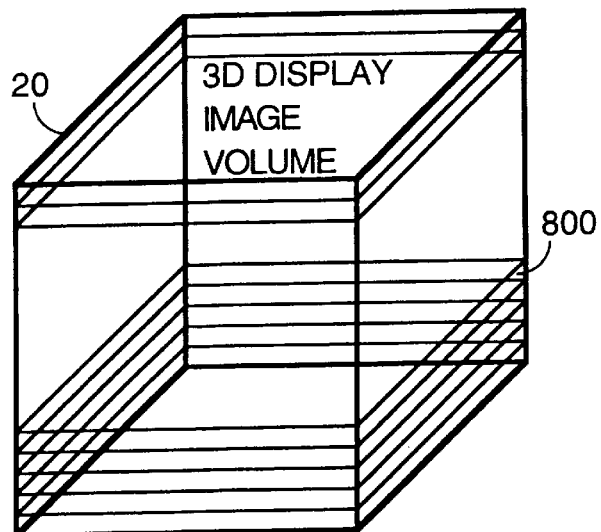
FIG. 8 depicts a monolithic display volume composed of a group of layers replicated many times, each layer in the group being capable of producing a specific primary color.

Another embodiment of a color display employs layering of the display material such that two or more differently doped layers, comprising a fundamental set, are replicated to build a bulk display volume. Each individual layer of the fundamental set is designed to provide a single color. The layers are sufficiently thin that they can not be distinguished separately by the eye and therefore appear to form a continuous bulk material. FIG. 8 shows such a structure in which alternating thin layers (800) have been stacked next to each other and affixed with an appropriate index matching adhesive. Alternatively, these layers can be grown or sputtered onto each other with standard processing technology. Because this embodiment separates the active ions into physically separate color groups or layers (as an example, $Yb^{3+}/Eu^{3+}$ for red, $Yb^{3+}/Tb^{3+}$ for green, and $Tm^{3+}$ for blue), little or no unwanted interaction or "crosstalk" arises between the ions in different layers.

Figure 8A:
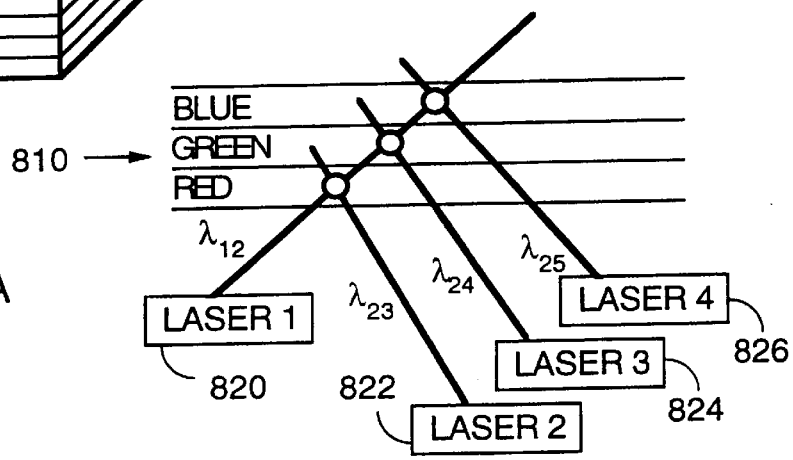
FIGS. 8a and 8b show an enlargements of a single RGB layer group of FIG. 8, each with a laser excitation scheme.

Individual colors can be readily addressed via wavelength multiplexing using 4 different wavelengths as shown in FIG. 8a, where a first laser, laser 1 (ref. no. 820), having a wavelength $\lambda_{12}$ pumps the active dopant or dopant combinations in each of the three primary color layer to the corresponding intermediate excited states. Wavelengths $\lambda_{23}$, $\lambda_{24}$, and $\lambda_{25}$ from lasers 2, 3 and 4 (ref. nos. 822, 824 and 826), or from a single laser tunable to give three such wavelengths, then stimulate individually the three layers to emit a combination of primary colors upon radiative relaxation.

Figure 8B:
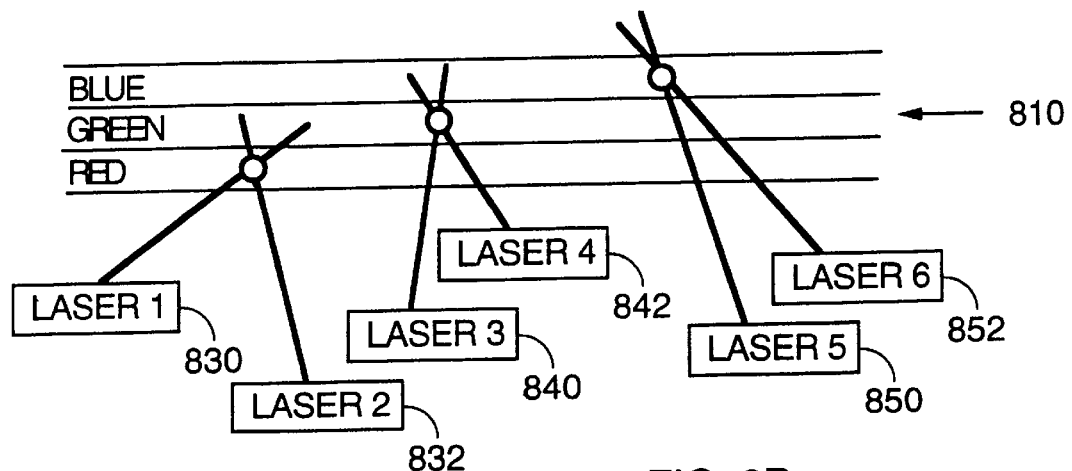

Another arrangement is shown in FIG. 8b, where up to six different lasers (ref. nos. 830, 832, 840, 842, 850, 852) are employed. Alternatively, in FIG. 8b, two tunable lasers can also be used such that one tunable laser performs the functions of lasers 1, 3, and 5 (ref. nos. 830, 840 and 850) while the second tunable laser (ref. nos. 832, 842 and 852) performs the functions of lasers 2, 4, and 6.

4. Active External Color Filtering

A fourth method for producing a color display involves the use of an active external color filter to separate various fluorescence wavelengths that are simultaneously emitted. Such filters, based on liquid crystal technology, are now commercially available (e.g., the RGB Color FASTFilter manufactured by DisplayTech, Boulder, Colo.). This approach is advantageous when a material system possesses an efficient multi-color upconversion process, but the individual colors can not be readily separated by wavelength or pulse-length multiplexing techniques.

F. Prototype Material Systems

The two-step two-photon process described herein for the display of three-dimensional information has been successfully demonstrated in a variety of the material systems including $Pr^{3+}$-doped low-phonon glasses, $Pr^{3+}/Yb^{3+}$-codoped low-phonon glasses, and $Tm^{3+}$-doped low-phonon glasses as described in more detail below.

1. $Pr^{3+}$ Doped Glasses

Figure 9:
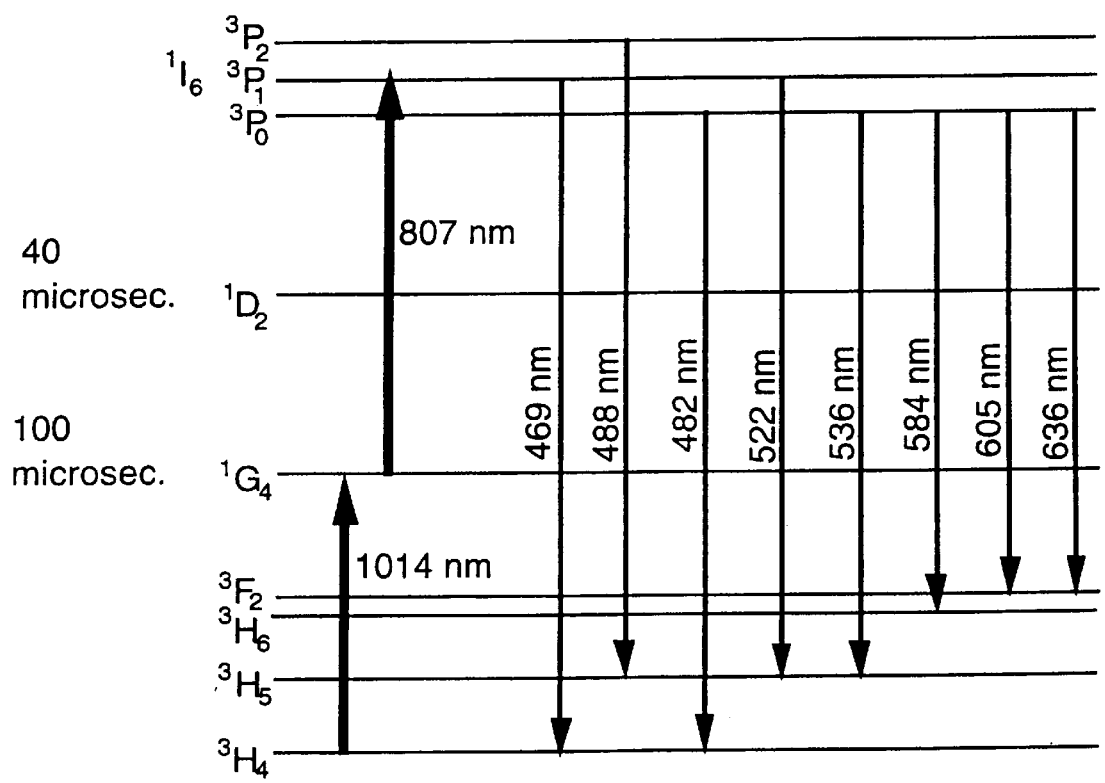
FIG. 9 is the energy level diagram of $Pr^{3+}$, showing the wavelengths used to create the upconversion display.
Figure 10:
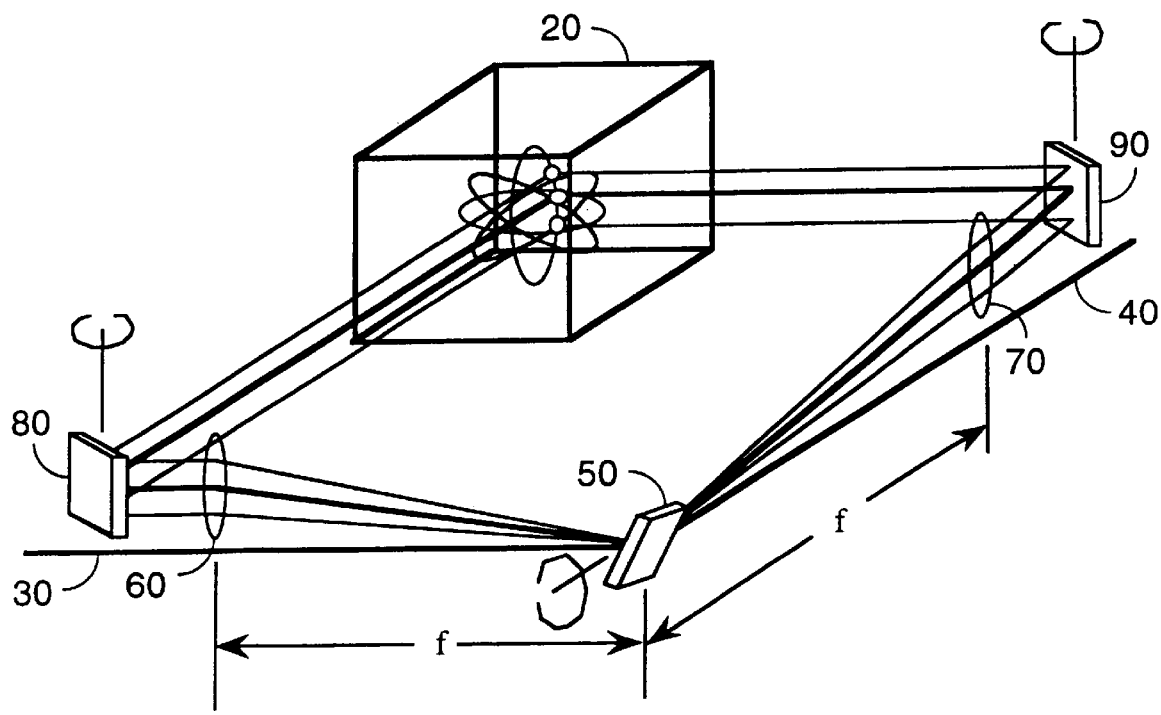
FIG. 10 depicts a two-beam, three-mirror scanning system used draw three-dimensional figures in the display volume.
Figure 11:
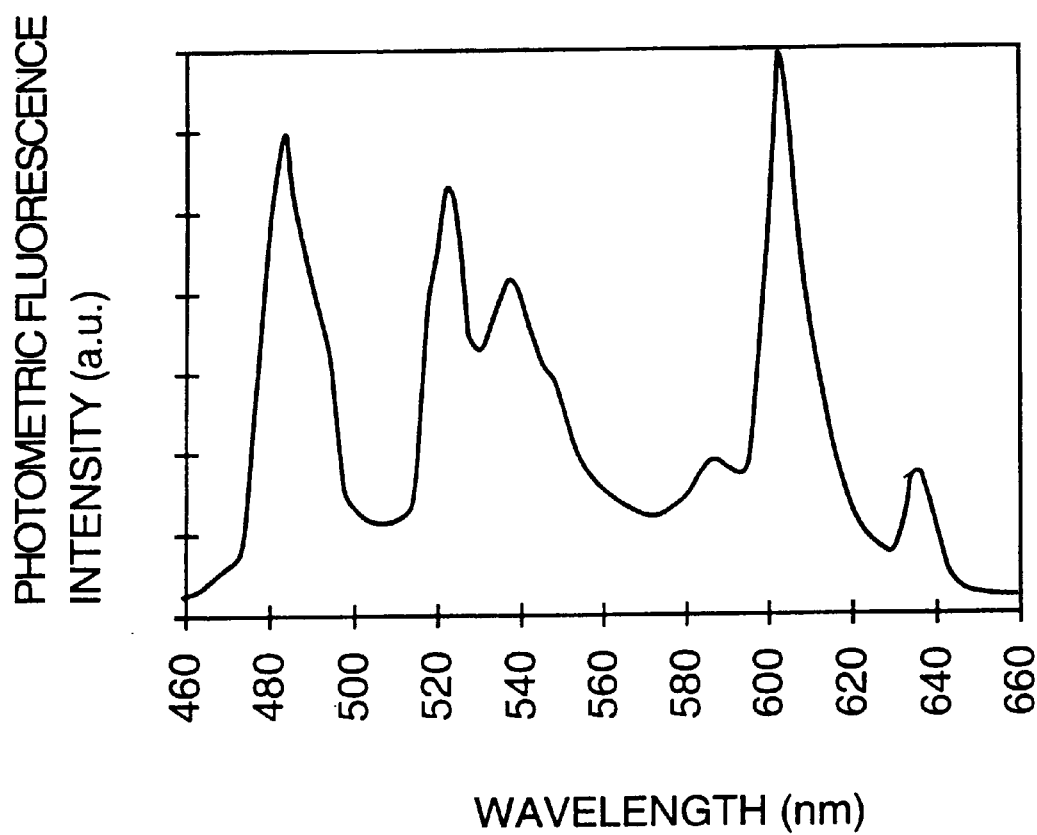
FIG. 11 depicts the measurement of the photometric spectral content of $Pr^{3+}$ upconversion fluorescence resulting from the two-beam pumping process illustrated in the energy diagram of FIG. 9.

Prototypes of the described device have been demonstrated in 0.5% Pr-doped heavy metal halide glass. Halide glasses based on Zirconium (ZBLAN), Hafnium (HBLAN), Indium, and Zinc, and chalcogenide glasses based on GeS and GaS have been used as hosts. $Pr^{3+}$ dopant concentrations ranging from 0.01% to 2.0% have been used, with the concentration yielding the brightest voxels shown experimentally to be between 0.4% and 0.6%. Photographs 1 and 2, attached to the present specification as Exhibits 1 and 2, show three-dimensional images being drawn in a bulk sample of Pr-doped ZBLAN. FIG. 9 is an energy level diagram of $Pr^{3+}$ showing the absorption and emission lines involved in the display. FIG. 10 shows one of a number of simple scanning systems used to draw dynamic images inside the display. In this three-scanner embodiment, Laser 1 has a wavelength of 1014 nm, corresponding to the absorption peak of the $^3H_4$-$^1G_4$ transition in $Pr^{3+}$. Laser 2 has a wavelength of 840 nm, corresponding to the absorption peak of the $^1G_4$-$^1I_6$ transition. FIG. 11 shows the multi-component photometric fluorescent emission (normalized by the spectral sensitivity of the human eye) resulting from this pumping scheme. Pump wavelengths that are at least 50 nm away from the resonant absorption peaks can still be used to induce the two-step process, although the upconversion efficiency is corresponding reduced. As an example, the $^3H_4$-$^1G_4$ transition has been successfully pumped at a wavelength of 1064 nm with a Nd:YAG laser. The absorption coefficient of the transition at this wavelength is an order of magnitude less than at the peak, but the two-step mechanism can still be induced.

2. $Pr^{3+}/Yb^{3+}$ Doped Glasses

The device has also been demonstrated in $Pr^{3+}/Yb^{3+}$ codoped heavy metal halide glass. Dopant concentrations of 0.5% $Pr^{3+}$ combined with 0.01% $Yb^{3+}$, 0.05% $Yb^{3+}$, and 0.1% $Yb^{3+}$ were successfully employed using pump laser wavelengths of 1014 nm and 840 nm. In general, concentrations of between 0% to 2% for $Yb^{3+}$, and for $Pr^{3+}$, from 0.01% to 2.0% mole percent concentration, may be employed. It has been found experimentally that the tail end of the excited $^2F_{5/2}$ level in $Yb^{3+}$ can absorb radiation at 1014 nm and can effectively transfer energy into the $^1G_4$ level of $Pr^{3+}$ thereby increasing the population of this level.

3. $Tm^{3+}$ Doped Glasses

Figure 12:
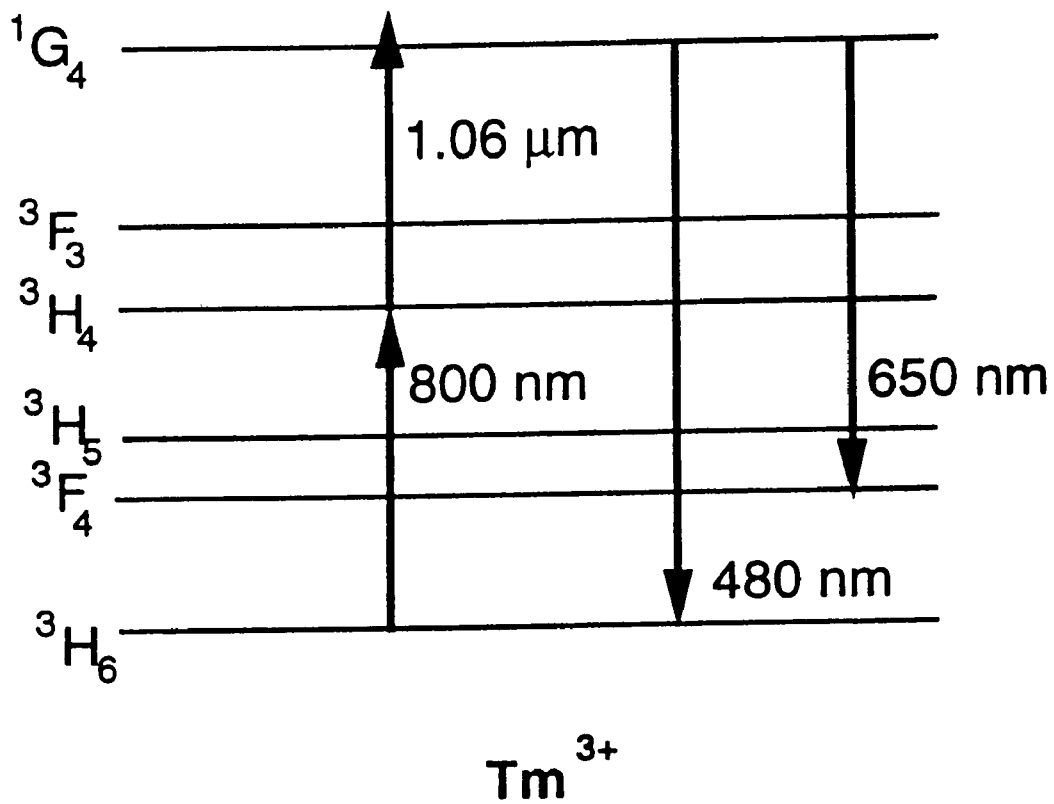
FIG. 12 is the energy level diagram of $Tm^{3+}$, showing the wavelengths used to create the display.

FIG. 12 shows the energy level structure of trivalent thulium in which a two-step, two-photon process has been highlighted. The first transition is from the $^3H_6$ to the $^3H_4$ level and is resonant with a pump laser at 800 nm. The second transition is from the $^3H_4$ to the $^1G_4$ and can be pumped nonresonantly with an Nd:YAG laser at 1064 nm. The fluorescent emission from the $^1G_4$ level in thulium is predominately blue with a strong line at 480 nm. This contrasts sharply with the fluorescence emitted from the $^3P_0$ level in praseodymium which is multi-component with strong peaks in the red, green, and blue. Photograph 3, attached to the present specification as exhibit 3, shows this pumping mechanism being used to draw a surface area in a 0.5% $Tm^{3+}$ doped sample of heavy metal halide glass (0.5%$Tm^{3+}$:ZBLAN).

G. Systems for Addressing the Display

The two-step, two-photon mechanism described herein defines a method for producing a single voxel at the intersection of two different wavelength infrared laser beams. In order to draw images, the point of intersection of the pump laser beams must occur nearly simultaneously at a multitude of locations inside the display volume. This can be accomplished by rapidly scanning the laser beams through out the image volume in a manner that will enable all voxels contributing to the image to be refreshed at a rate sufficiently high to eliminate the appearance of "flicker" in the display. Typically this rate is between 20 Hz and 30 Hz. Various systems for obtaining high speed, high precision deflection of laser beams are commercially available and include (but are not limited to) mechanical galvanometer scanners with position feedback and acousto-optic devices, all of which are capable of operating at frequencies into the megahertz with sub arc second accuracy.

A practical embodiment of this device would be "pumpable" with low power infrared laser diodes or LEDs. Laser diodes are small, light weight, and have the highest electrical to optical conversion efficiency of any lasers that are commercially available at this time. They can be thermoelectrically cooled, have current controlled output power, and require low supply voltages (2 V). In addition, they can be modulated at frequencies above a gigahertz.

Deflective scanning of multiple laser beams, coupled with appropriate on-off modulation, current control for brightness, and dynamic focusing, will enable numerous highly complex three-dimensional (static and dynamic) multi-color images to be drawn in this display. Many permutations of system design, with variations in the number and type of laser sources and the number of scanners can be envisioned for this purpose, the optimal system configuration depending on the complexity of images to be displayed in the final device.

1. Multiple Beam Scanning

On one end of the spectrum of system designs is the use of only two pump lasers, one of each necessary wavelength, three single axis scanners, and two focusing axes. This concept has been demonstrated to work in $Pr^{3+}$ doped halide glass. This system is illustrated in FIG. 10. Pump laser beams (30) and (40) are both deflected with a single axis scan mirror (50). This synchronizes the angular deflection of the two beams. Pump beams (30) and (40) are subsequently refracted through two lenses (60 and 70) which serve to focus the energy in the beams. Deflective scanners (80) and (90) provide a second deflection axis for each pump beam. In this manner, each pump beam has two deflection axes which can be controlled to position the intersection of the beams at any desired location within the display volume (20).

An alternative approach would be to employ multiple lasers of each necessary wavelength, and multiple deflective scanning systems that would function in parallel, to achieve complex image display at lower scan rates and with lower pump laser powers. The power requirements of each laser would thus be reduced by the number of lasers working in parallel. Scanners could be coupled or controlled independently, and a single scan axis could be used for multiple lasers.

2. Combination Sheet and Beam Scanning

Figure 13:
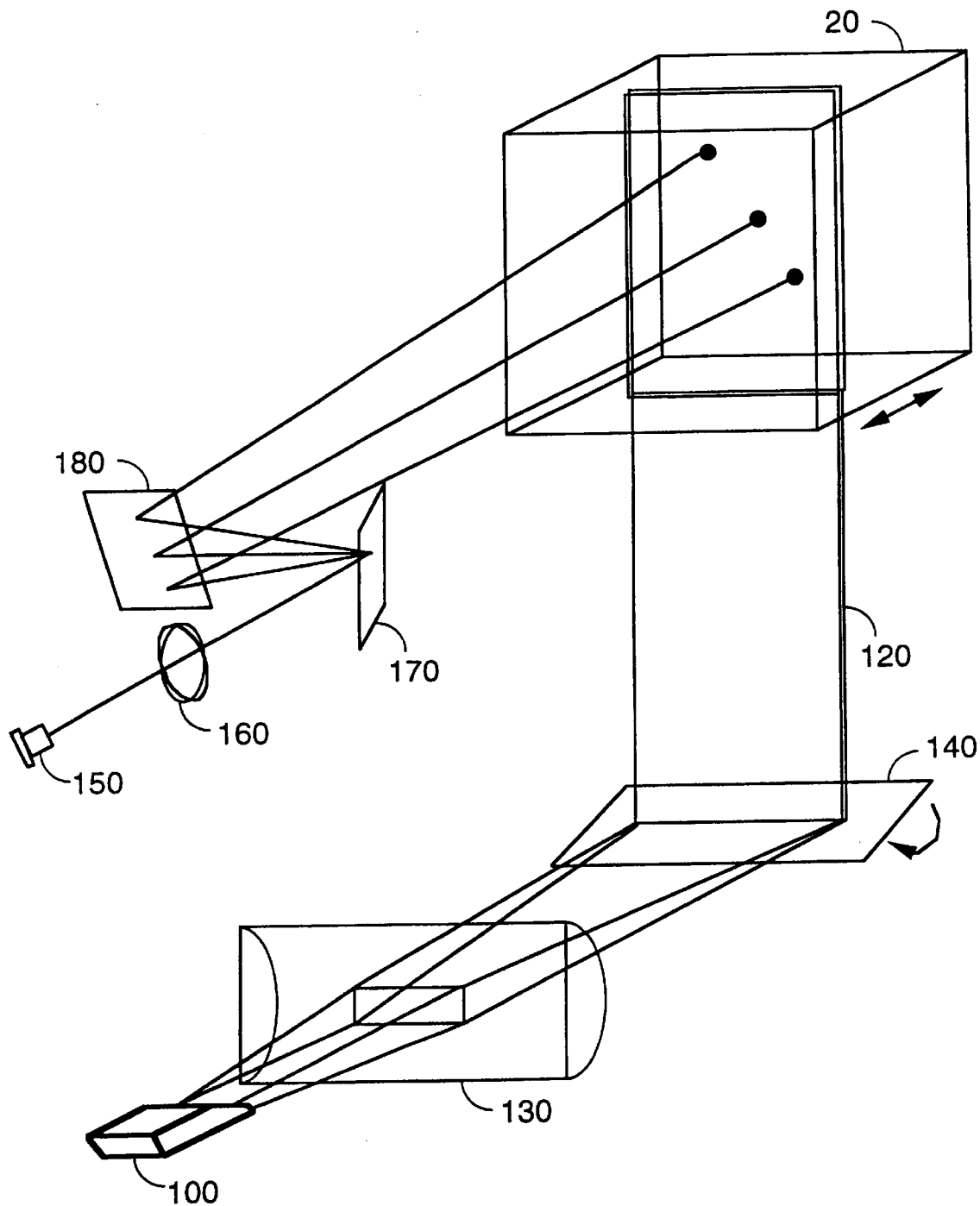
FIG. 13 depicts a scanning system in which a sheet of laser light from a laser diode array and a single-emitter laser diode are used to draw images inside the display volume.

A further embodiment of parallel system architecture would employ laser diode slabs or linear laser diode arrays that have been focused into planes. FIG. 13 shows a linear laser diode array (100) that has been focused into a sheet with an appropriate optical system (130) and is swept through the display volume with a deflective scanning system (140). The second laser (150) is a single or multiple emitter that is focused with a second optical system (160), and scanned with a dual-axis scanning system (170 and 180) to intersect the plane (120) inside the image volume (20). This concept has been demonstrated in $Pr^3$ doped heavy metal halide glass. Multiple diodes arrays could be butted next to each other, end to end, to produce a sheet of laser light wide enough to accommodate a display of any width. An inherent feature of this design is that it reduces the accuracy requirements of the scanning system as a beam will always intersect a plane at near normal incidence in this configuration.

Figure 14A:
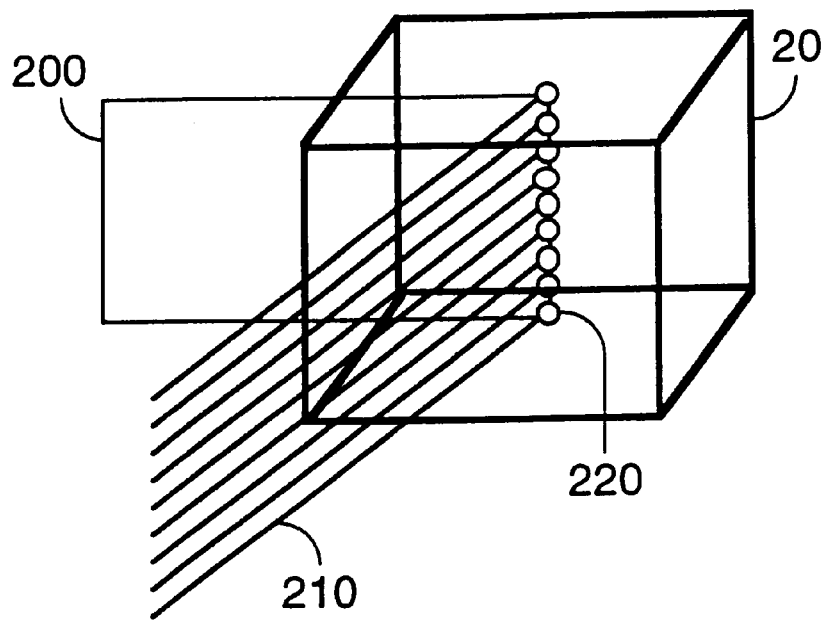
FIGS. 14a and 14b show focused planes of laser light from laser diode arrays and laser diode bars being used to address lines in the display to draw three-dimensional figures.
Figure 14B:
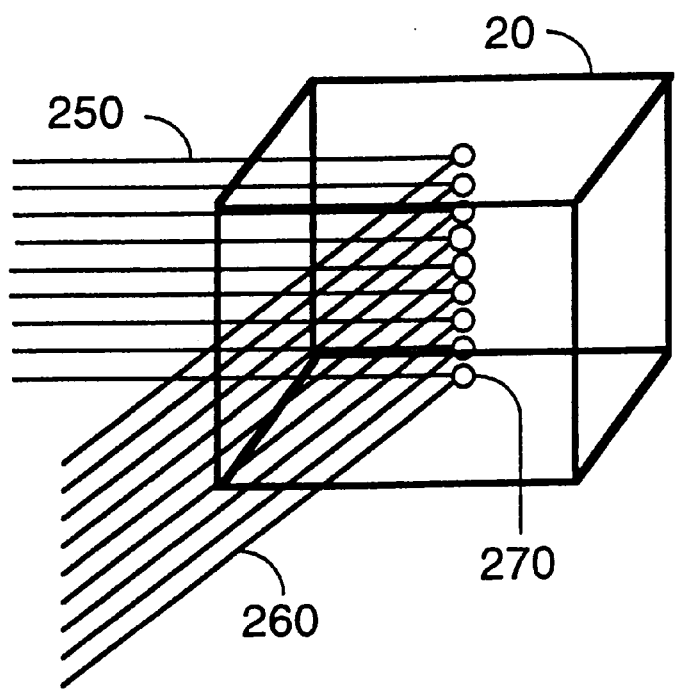

In addition to using one sheet of focused light from laser diode arrays, two such sheets could be positioned at normal incidence to each other to intersect in a line inside the image volume. FIG. 14 a shows a plane of laser light from a diode slab (200) intersecting a focused plane from a linear diode array (210) inside the display volume (20). The intersection of these two laser planes (200 and 210) is a line (220). As linear laser diode arrays are independently addressable, the specific pixels along the line of intersection (220) can be addressed by controlling the on/off relationship of only the diode array (210), at any position in the image volume. This would enable the device to be addressable with one laser diode slab and one laser diode array, in conjunction with an appropriate scanning system. FIG. 14b shows a similar architecture in which two linear diode arrays (250 and 260) intersect inside the display volume (20) to form a line (270). In this configuration, individual emitters from either laser array may be modulated to address the voxels in the line (270).

Figure 15:
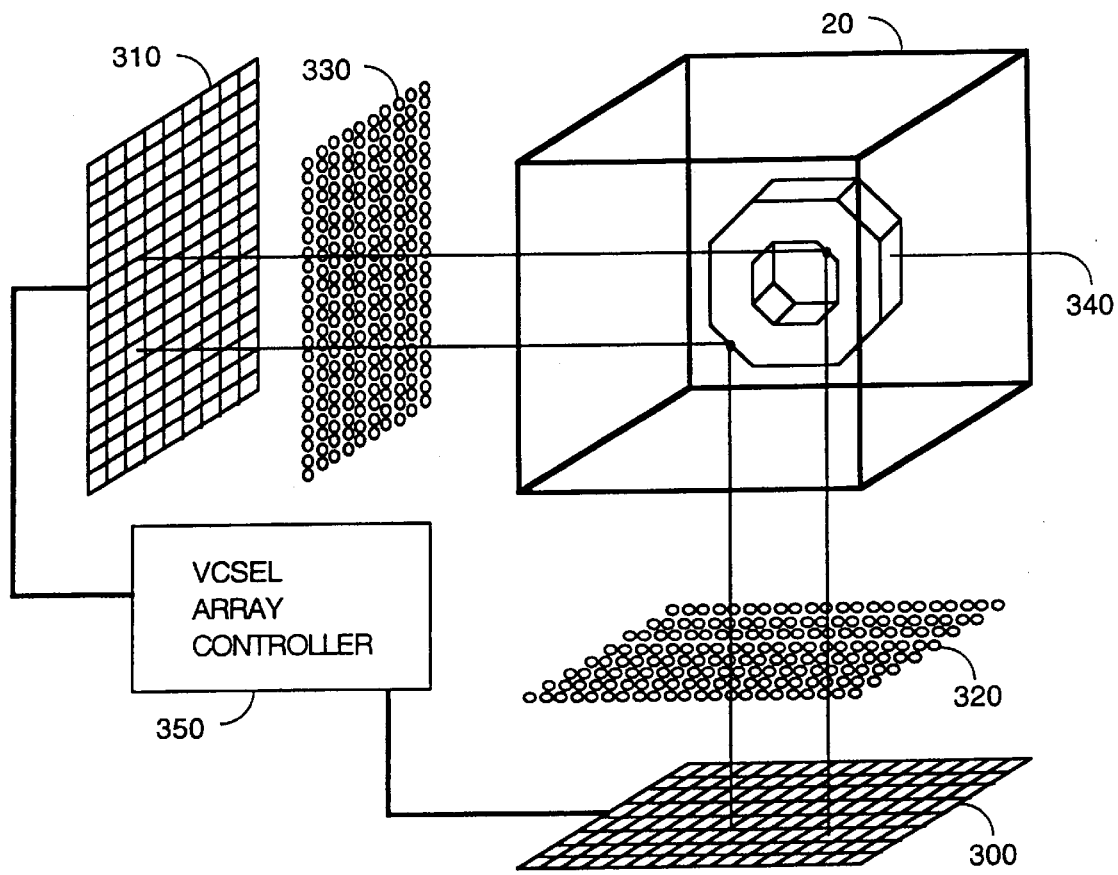
FIG. 15 illustrates two-dimensional, independently addressable laser diode arrays being employed to draw images in the display.

As can be appreciated throughout FIGS. 13, 14 and 15, a computer may determine which voxels to activate for illumination, by determining which lasers to turn on (in an array of lasers), and/or at which angle of deflection a beam should be traced out (for a single laser/scanner), in accordance with what type of image figure is to be traced out.

3. Two-Dimensional Laser Diode Array Scanning

FIG. 15 illustrates a system architecture in which deflective scanning of laser beams, and all of the associated positioning feedback and accuracy requirements, has been completely eliminated and replaced with two-dimensional arrays of vertical cavity surface emitting laser diodes (VCSELs). Each individual emitter on such an array is independently addressable and is simply modulated on or off to address voxels in the display volume. Two-dimensional VCSEL arrays (300 and 310) are positioned on orthogonal faces of the display volume (20). Micro lens arrays (320 and 330) are used to focus the beams from the VCSEL arrays. Images (340) are addressed via a computer or processor (350) which modulates the appropriate emitters in each laser plane. This configuration has the advantage of reducing the laser power requirements to the minimum required to turn on one row of pixels the entire length of the image volume, as one emitter is employed for each row. Additionally, VCSELs can be grown in micro-clusters of different wavelengths allowing wavelength multiplexed addressing to be incorporated directly into this system. Each individual laser on a VCSEL array can be operated continuously (cw) or modulated at up to gigahertz frequencies. The on/off duty cycle can also be controlled to provide pulse encoded temporal multiplexing for addressing color. VCSELs are produced on individual chips whose dimensions and laser diode density (no. of lasers per unit area) can be specified for the application. This enables the laser array to be fabricated in a modular fashion which in turn facilitates the replacement of any elements that fail during operation.

A computer or processor for storage and computation of the database, and control of all deflection and modulation hardware, would be an intrinsic part of the system configuration of the present invention.

The foregoing description is offered for illustrative purposes only. Numerous modifications and variations may be readily apparent to those skilled in the art, while still falling within the spirit and scope of the invention as claimed herein below.

I claim:

1. A three-dimensional display, comprising:
   a laminated structure, the laminated structure having a first layer and a second layer, the first layer being coupled to the second layer;
   the first layer including a first host material, a first dopant material, and a plurality of first layer voxels;
   first layer voxels in the plurality of first layer voxels containing at least some of the first dopant material, wherein the first dopant material emits photons of a first visible wavelength in response to absorption of photons of a first pump wavelength and photons of a second pump wavelength;

the second layer including a second host material, a second dopant material, and a plurality of second layer voxels; and second layer voxels in the plurality of second layer voxels containing at least some of the second dopant material, wherein the second dopant material emits photons of a second visible wavelength in response to absorption of photons of a third pump wavelength and photons of a fourth pump wavelength.

2. The display of claim 1, wherein:
the first host material and the second host material include the same type of material.

3. The display of claim 1, wherein:
the first dopant material and the second dopant material include the same type of material.

4. The display of claim 1, wherein:
the first pump wavelength and the third pump wavelength include the same wavelength.

5. The display of claim 1, wherein:
the photons of the first pump wavelength and the third pump wavelength include infrared photons.

6. The display of claim 1, wherein:
the photons of the first pump wavelength, the second pump wavelength, the third pump wavelength, and the fourth pump wavelength include infrared photons.

7. The display of claim 1, wherein:
the first visible wavelength and the second visible wavelength are the same wavelength.

8. The display of claim 1 wherein:
the first host material is a low phonon material.

9. The display of claim 1, wherein:
the first host material includes low phonon glass.

10. The display of claim 1, wherein:
the first host material includes fluoride glass.

11. The display of claim 1, wherein:
the first layer and the second layer are bonded together.

12. The display of claim 1, wherein:
the first layer and the second layer are coupled using index matching fluid.

13. The display of claim 1, wherein:
the first layer and the second layer are coupled using optical adhesive.

14. The display of claim 1, wherein:
the concentration of the first dopant material in the first host material is different from the concentration of the second dopant material in the second host material.

15. The display of claim 1, comprising:
a deflection device for intersecting photons of the first pump wavelength and photons of the second pump wavelength in first layer voxels in the plurality of first layer voxels.

16. The display of claim 1, comprising:
a first pair of single axis deflection devices and a second pair of single axis deflection devices, a first laser beam including photons of the first pump wavelength and intersecting the first pair of single axis deflection devices, a second laser beam including photons of the second pump wavelength and intersecting the second pair of single axis deflection devices; and a computer processor for controlling the first pair of single axis deflection devices and the second pair of single axis deflection devices to intersect photons of the first pump wavelength and photons of the second pump wavelength in first layer voxels in the plurality of first layer voxels.

17. The display of claim 16, wherein:
the first laser beam is produced using a pulsed laser.

18. The display of claim 17, wherein:
the pulsed laser includes a Q-switched laser.

19. The display of claim 17, wherein:
the pulsed laser includes a mode-locked laser.

20. The display of claim 17, wherein:
the pulsed laser includes an amplitude modulated diode laser.

21. The display of claim 16, wherein:
the first laser beam is focussed.

22. The display of claim 1, comprising:
a first pair of single axis deflection devices and a second pair of single axis deflection devices, a first laser which outputs a first laser beam including photons of the first pump wavelength and intersecting the first pair of single axis deflection devices, a second laser which outputs a second beam including photons of the second pump wavelength and intersecting the second pair of single axis deflection devices; and a computer processor for controlling the first pair of single axis deflection devices and the second pair of single axis deflection devices to intersect photons of the first pump wavelength and photons of the second pump wavelength in first layer voxels in the plurality of first layer voxels.

23. The display of claim 1, comprising:
a first pair of single axis deflection devices and a second pair of single axis deflection devices, a first diode laser which outputs a first laser beam including photons of the first pump wavelength and intersecting the first pair of single axis deflection devices, a second diode laser which outputs a second beam including photons of the second pump wavelength and intersecting the second pair of single axis deflection devices; and a computer processor for controlling the first pair of single axis deflection devices and the second pair of single axis deflection devices to intersect photons of the first pump wavelength and photons of the second pump wavelength in first layer voxels in the plurality of first layer voxels.

24. The display of claim 1, comprising:
a laser which outputs photons of the first pump wavelength;

an array of lasers which outputs photons of the second pump wavelength along a plane;

a scanner which sweeps the plane of second pump wavelength photons along a direction of the display; and a scanner for sweeping the first pump wavelength photons to intersect the plane of second pump wavelength photons in first layer voxels in the plurality of first layer voxels.

25. The display of claim 1, comprising:
a laser diode which outputs photons of the first pump wavelength;

an array of laser diodes which outputs photons of the second pump wavelength along a plane;

a scanner for sweeping the plane of second pump wavelength photons along a direction of the laminated structure; and a scanner for sweeping the first pump wavelength photons to intersect the plane of second pump wavelength photons in first layer voxels in the plurality of first layer voxels.

26. The display of claim 1, comprising:

a laser beam containing photons of the first pump wavelength;

an array of laser beams containing photons of the second pump wavelength;

a scanner for sweeping the array of laser beams of the second pump wavelength photons along a direction of the laminated structure; and a scanner for sweeping the laser beam to intersect laser beams in the array of laser beams in first layer voxels in the plurality of first layer voxels.

27. The display of claim 1, comprising:

a first array of laser beams which contain photons of the first pump wavelength;

a second array of laser beams which contain photons of the second pump wavelength; and a computer processor for activating predetermined laser beams in the first and second arrays to intersect photons of the first and second pump wavelengths in first layer voxels in the plurality of first layer voxels.

28. The display of claim 1, comprising:

an array of lasers which outputs photons of the first pump wavelength;

an array of lasers which outputs photons of the second pump wavelength; and a computer processor for activating predetermined lasers in the first and second pump wavelength arrays to intersect photons of the first and second pump wavelengths in first layer voxels in the plurality of first layer voxels.

29. The display of claim 1, comprising:

an array of laser diodes which outputs photons of the first pump wavelength;

an array of laser diodes which outputs photons of the second pump wavelength; and a computer processor for activating predetermined laser diodes in the first and second pump wavelength arrays to intersect photons of the first and second pump wavelengths in first layer voxels in the plurality of first layer voxels.

30. The display of claim 1, wherein:

an upperstate lifetime of the first dopant material is shorter than 1/20 of a second.

31. The display of claim 1, wherein:

an upperstate lifetime of the second dopant material is shorter than 1/20 of a second.

32. The display of claim 1, wherein:

the display has one flat side.

33. The display of claim 1, wherein:

the display is shaped like a cube.

34. The display of claim 1, wherein:

the first dopant includes ytterbium.

35. The display of claim 1, wherein:

the first visible wavelength is red.

36. The display of claim 1, wherein:

the second visible wavelength is green.

37. The display of claim 1, wherein:

the first visible wavelength is red and the second visible wavelength is green.

38. The display of claim 1, wherein:

the laminated structure includes a third layer, the third layer being coupled to the second layer, the third layer including a third host material, a third dopant material, and a plurality of third layer voxels;

third layer voxels in the plurality of third layer voxels containing at least some of the third dopant material, wherein the third dopant material emits photons of a third visible wavelength in response to absorption of photons of a fifth pump wavelength and photons of a sixth pump wavelength; and wherein the third host material is a low phonon material.

39. The display of claim 38, wherein:

the third visible wavelength is blue.

40. The display of claim 38, wherein:

the first visible wavelength is red, the second visible wavelength is green and the third visible wavelength is blue.

41. The display of claim 1, comprising:

a laser beam which includes photons of the first pump wavelength;

an array of laser beams which include photons of the second pump wavelength along a plane;

a pair of single axis scanners for raster scanning the photons of the first pump wavelength in the display, and a single axis scanner for raster scanning which sweeps the plane of second pump wavelength photons in the laminated structure; and a computer processor for controlling the pair of single axis scanners and the single axis scanner to intersect the plane of second pump wavelength photons in first layer voxels in the plurality of first layer voxels.

42. The display of claim 41, wherein:

the first laser beam is produced using a pulsed laser.

43. The display of claim 42, wherein:

the pulsed laser includes a Q-switched laser.

44. The display of claim 42, wherein:

the pulsed laser includes a mode-locked laser.

45. The display of claim 42, wherein:

the pulsed laser includes an amplitude modulated diode laser.

46. The display of claim 41, wherein:

the first laser beam is focussed.

47. The display of claim 1, comprising:

a laser which outputs photons of the first pump wavelength;

an array of lasers which outputs photons of the second pump wavelength along a plane;

a pair of single axis scanners for raster scanning the photons of the first pump wavelength in the display, and a single axis scanner for raster scanning which sweeps the plane of second pump wavelength photons in the laminated structure; and a computer processor for controlling the pair of single axis scanners and the single axis scanner to intersect the plane of second pump wavelength photons in first layer voxels in the plurality of first layer voxels.

48. The display of claim 1, comprising:

a diode laser which outputs photons of the first pump wavelength;

an array of diode lasers which outputs photons of the second pump wavelength along a plane;

a pair of single axis scanners for raster scanning the photons of the first pump wavelength in the display, and a single axis scanner for raster scanning which sweeps the plane of second pump wavelength photons in the laminated structure; and a computer processor for controlling the pair of single axis scanners and the single axis scanner to intersect the plane of second pump wavelength photons in first layer voxels in the plurality of first layer voxels.

49. The display of claim 1, wherein:

the first host material includes a heavy metal halide glass selected from the group consisting of the heavy metal halide glasses based on the elements zirconium, hafnium, cadmium, indium, zinc, barium, lanthanum, aluminum, and sodium.

50. The display of claim 1, wherein:

the first host material includes the heavy metal halide glass ZBLAN.

51. The display of claim 1, wherein:

the first host material includes the compound lanthanum fluoride.

52. The display of claim 1, wherein:

the first host material includes the compound lanthanum chloride.

53. The display of claim 1, wherein:

the first host material includes a chalcogenide material.

54. The display of claim 53, wherein:

the chalcogenide material includes a chalcogenide material based on sulfides of the 3rd and 4th group elements of the periodic table.

55. The display of claim 1, wherein:

the first host material includes a low phonon optically transparent material which has a transparency in the far infrared range with a greater than 8 $\mu$m cutoff edge.

56. The display of claim 1, wherein:

the first host material is an alkali-metal halide crystal selected from the group consisting of halide crystals of NaCl, KCl, KBr, CsBr and CsI.

57. The display of claim 56, wherein:

the second host material is an alkali-metal halide crystal selected from the group consisting of halide crystals of NaCl, KCl, KBr, CsBr and CsI.

58. The display of claim 1, wherein:

the first dopant material includes trivalent praseodymium.

59. The display of claim 58, wherein:

the second dopant material includes trivalent praseodymium.

* * * * *